(12) United States Patent
Borges Nicolau et al.

(10) Patent No.: US 9,817,320 B2
(45) Date of Patent: Nov. 14, 2017

(54) LITHOGRAPHIC METHOD AND APPARATUS

(71) Applicant: ASML Netherlands B.V., Veldhoven (NL)

(72) Inventors: Jaqueline Borges Nicolau, Veldhoven (NL); Hannah Noble, Veldhoven (NL); Johannes Jacobus Matheus Baselmans, Veldhoven (NL); Bart Smeets, Veldhoven (NL); Paulus Jacobus Maria Van Adrichem, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/032,245

(22) PCT Filed: Oct. 2, 2014

(86) PCT No.: PCT/EP2014/071182
§ 371 (c)(1),
(2) Date: Apr. 26, 2016

(87) PCT Pub. No.: WO2015/074796
PCT Pub. Date: May 28, 2015

(65) Prior Publication Data
US 2016/0274462 A1     Sep. 22, 2016

Related U.S. Application Data

(60) Provisional application No. 61/906,764, filed on Nov. 20, 2013.

(51) Int. Cl.
*G03F 7/20* (2006.01)
*G06T 5/00* (2006.01)

(52) U.S. Cl.
CPC ........ *G03F 7/70566* (2013.01); *G03F 7/2026* (2013.01); *G03F 7/705* (2013.01);
(Continued)

(58) Field of Classification Search
CPC ............. G03F 7/70425; G03F 7/70433; G03F 7/70483; G03F 7/70491; G03F 7/2026;
(Continued)

(56) References Cited

U.S. PATENT DOCUMENTS 7,738,182 B2   6/2010   McGuire, Jr.
8,126,669 B2   2/2012   Totzeck et al.
(Continued)

FOREIGN PATENT DOCUMENTS

JP   2007-035671 A   2/2007
JP   2007-180103 A   7/2007
(Continued)

OTHER PUBLICATIONS

Fujii et al., "Polarization properties of state-of-art lithography optics represented by first canonical coordinate of Lie group," Optical Microlithography XX, Proc. of SPIE, vol. 6520, No. 65204W, 2007; 8 pages.
(Continued)

*Primary Examiner* — Michelle M Iacoletti
(74) *Attorney, Agent, or Firm* — Sterne, Kessler, Goldstein & Fox P.L.L.C.

(57) ABSTRACT

A method of correcting an optical image formed by an optical system, the method including obtaining a map indicative of a polarization dependent property of the optical system across a pupil plane of the optical system for each spatial position in an image plane of the optical system, combining the map indicative of the polarization dependent property of the optical system with a radiation map of the intensity and polarization of an input radiation beam to form
(Continued)

an image map, and using the image map to correct an optical image formed by directing the input radiation beam through the optical system.

20 Claims, 5 Drawing Sheets (52) U.S. Cl.
CPC ........ G03F 7/706 (2013.01); G03F 7/70258 (2013.01); G03F 7/70425 (2013.01); G03F 7/70433 (2013.01); G06T 5/00 (2013.01)

(58) Field of Classification Search
CPC ... G03F 7/70666; G03F 7/70258; G03F 7/706
See application file for complete search history.

(56) References Cited

U.S. PATENT DOCUMENTS

| | | | |
|---|---|---|---|
| 8,527,253 | B2 | 9/2013 | Zhang et al. |
| 2007/0046921 | A1 | 3/2007 | Takahashi et al. |
| 2009/0021719 | A1 | 1/2009 | Fiolka et al. |
| 2009/0066925 | A1 | 3/2009 | Ohsaki et al. |
| 2009/0070083 | A1 | 3/2009 | Zhang et al. |
| 2009/0070730 | A1 | 3/2009 | Zhang et al. |
| 2009/0180093 | A1 | 7/2009 | Arai |
| 2009/0201480 | A1 | 8/2009 | Arai |
| 2009/0306921 | A1* | 12/2009 | Totzeck ............. G01M 11/0257 702/82 |
| 2010/0058263 | A1 | 3/2010 | Tyminski et al. |
| 2010/0180252 | A1 | 7/2010 | Kawashima |
| 2011/0007293 | A1 | 1/2011 | Fiolka et al. |
| 2014/0244215 | A1* | 8/2014 | Nakayama ............... G03F 1/70 702/189 |

FOREIGN PATENT DOCUMENTS

| | | |
|---|---|---|
| JP | 2009-068922 A | 4/2009 |
| JP | 2009-170466 A | 7/2009 |
| JP | 2010-160442 A | 7/2010 |

OTHER PUBLICATIONS

Geh et al., "The impact of projection lens polarization properties on lithographic process at hyper-NA," Optical Microlithography XX, Proc. of SPIE, vol. 6520, No. 65200F, 2007; 18 pages.

International Preliminary Report on Patentability directed to related International Patent Application No. PCT/EP2014/071182, dated May 24, 2016; 9 pages.

International Search Report directed to related International Patent Application No. PCT/EP2014/071182, dated Jan. 20, 2015; 4 pages.

Written Opinion of the International Searching Authority directed to related Patent Application No. PCT/EP2014/071182, dated Jan. 20, 2015; 8 pages.

* cited by examiner

FIG. 6

LITHOGRAPHIC METHOD AND APPARATUS

CROSS-REFERENCE TO RELATED APPLICATIONS

This application claims the benefit of U.S. provisional application 61/906,764, which was filed on 20 Nov. 2013, and which is incorporated herein in its entirety by reference.

FIELD

The present invention relates to a method of correcting polarization dependent optical effects. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

SUMMARY

Radiation that has been patterned by the patterning device is focussed onto the substrate using a projection system. The projection system may introduce on more optical aberrations, which cause the image formed from the substrate to deviate from that which is imparted by the patterning device.

It is desirable, for example, to correct for such one or more aberrations.

It is desirable, for example, to provide an image correction method which at least partially addresses one or more of the problems of the art, whether identified herein or elsewhere.

According to an aspect, there is provided a method of correcting an optical image formed by an optical system, the method comprising obtaining a map indicating a polarization dependent property of the optical system across a pupil plane of the optical system for each spatial position in an image plane of the optical system, combining the map of the polarization dependent property of the optical system with a radiation map of the intensity and polarization of an input radiation beam to form an image map, and using the image map to correct an optical image formed by directing the input radiation beam through the optical system.

Correction for the effect of the polarization dependent property is beneficial because it improves the accuracy of the optical image formed by the optical system. References herein to correcting an optical image may be interpreted as meaning that the optical image is adjusted to bring it closer to a desired optical image. It is not intended to be limited to adjusting the optical image such that it corresponds perfectly to a desired optical image.

A pattern may be imparted to the input radiation beam by a patterning device before it enters the optical system, the radiation map containing information relating to the pattern.

Correction of the optical image may be achieved by determining a correction map as the difference between the image map and the radiation map, and then using the correction map to correct an optical image formed by directing the input radiation beam through the optical system.

Correction of the optical image may be achieved by using the image map to determine the effect of the polarization dependent property on an optical image formed by directing the input radiation beam through the optical system, and then performing a correction which corrects that optical image.

The correction of the optical image may be achieved by manipulating one or more optical (e.g., lens) elements of the optical system.

The correction of the optical image may be achieved by modifying a pattern of the patterning device.

Obtaining the map of the polarization dependent property may comprise measuring the map of the polarization dependent property.

Measuring the map of the polarization dependent property may involve sequentially directing three or more calibration radiation beams with different polarization states through the optical system, determining an output map of a property of the radiation exiting the optical system for each calibration radiation beam, and combining the output maps to determine a map of the magnitude and direction of the polarization dependent property of the optical system across the pupil plane thereof.

The polarization dependent property of the optical system may comprise retardation and the output map of a property of the radiation exiting the optical system may comprise a wavefront.

The wavefronts that exit the optical system may be measured using a shearing interferometer.

The polarization dependent property of the optical system may comprise diattenuation and the output map of a property of the radiation exiting the optical system may comprise an intensity map.

One or more of the calibration radiation beams may have a dipole intensity distribution and may be linearly polarized in a direction that is substantially perpendicular to a line that bisects two opposing sectors of the dipole, the orientation of the dipoles for different calibration radiation beams being different.

Obtaining the map of the polarization dependent property may comprise modelling the effect of the optical system on the radiation beam using modelling software.

Obtaining the map of the polarization dependent property may involve determining coefficients in a linear expansion of orientation Zernike polynomials (OZPs).

Obtaining the map of the polarization dependent property may involve retrieving the map from a memory.

Polarization independent effects may also be corrected for.

The optical system may be the projection system of a lithographic apparatus.

According to an aspect, there is provided a lithographic apparatus comprising an illumination system configured to provide a beam of radiation, a support structure configured to support a patterning device, the patterning device capable of imparting the radiation beam with a pattern in its cross-section, a substrate table configured to hold a substrate, a projection system configured to projecting the patterned radiation beam onto a target portion of the substrate to form an image thereon, and a processor operable to: obtain a map indicating a polarization dependent property of the projection system across a pupil plane of the optical system for each spatial position in an image plane of the optical system, combine the map of the polarization dependent property with a radiation map of the intensity and polarization of an input radiation beam in the pupil plane to form an image map in the pupil plane, and use the image map to correct an image formed by the projection system when it receives the input radiation beam.

The apparatus may be operable to implement any of the features of a method described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
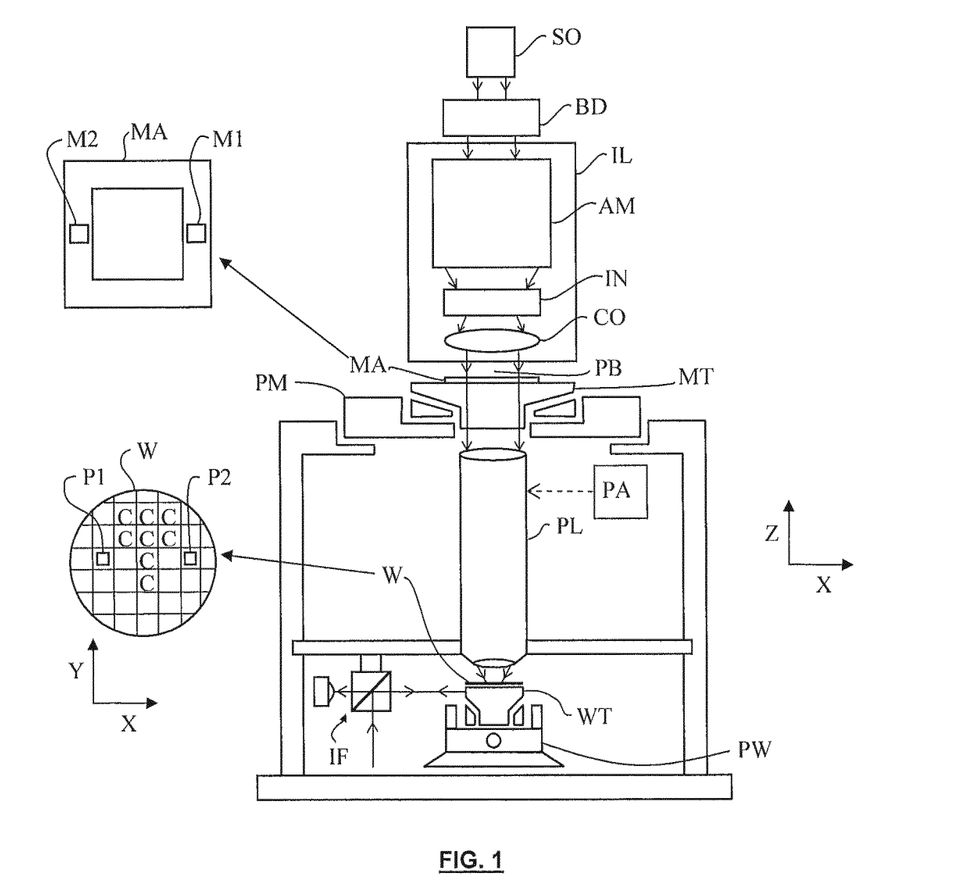
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL to condition a beam PB of radiation (e.g. UV radiation or DUV radiation).
- a support structure MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution (see FIGS. 5A-C respectively). A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole (see FIG. 5A). The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector (see FIG. 5B). This polarization mode may be referred to as XY polarization. Similarly, for a hexapole illumination mode (see FIG. 5C) the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

In one embodiment, the diffraction grating is sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithographic apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithographic apparatus LA. Using a computational lithography technique, the patterning device MA may be designed to at least partially correct for apodizations.

For polarized radiation and sophisticated illumination modes (e.g. dipole or quadrupole or free form pupils), polarization effects may be significant. An embodiment of the invention provides a method for correcting an optical image formed by the projection system PL of the lithographic apparatus LA that takes into account polarization effects.

Figure 2:
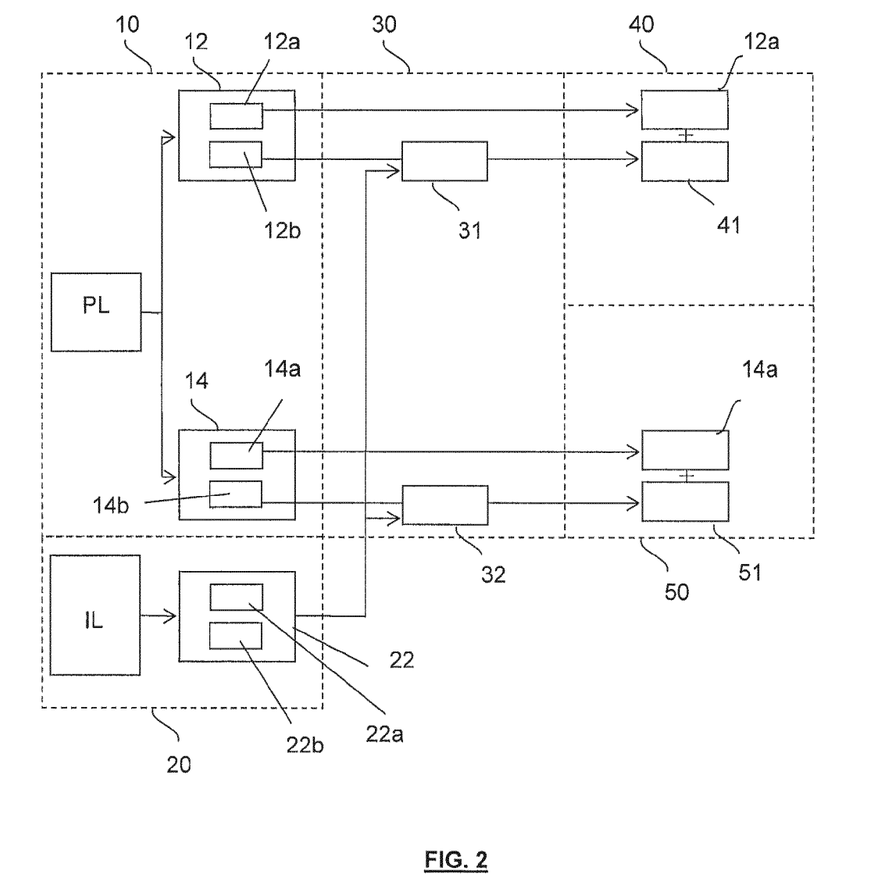
FIG. 2 is a schematic illustration of a method of correcting an image according to an embodiment of the present invention.

Referring to FIG. 2, step 10 involves characterizing one or more optical properties of the projection system PL. This may be performed in two stages 12, 14, which may be performed in any order. In stage 12, the effect of the projection system PL on the phase of radiation propagating through it is determined. In stage 14, the effect of the projection system PL on the amplitude of radiation propagating through it is determined. Each of the stages 12, 14 involves the determination of a map of a polarization dependent property and a map of a polarization independent property of the projection system PL in its pupil plane. In an embodiment only stage 12 or 14 may be performed, resulting in respectively phase dependent corrections and amplitude dependent corrections only.

As polarized radiation propagates through an optical element, in general, its polarization state may change. The polarization state of a coherent polarized electromagnetic wave may be represented by a two component complex vector, known as the Jones vector. In general, the polarization state of electromagnetic radiation may be represented by an ellipse in a plane perpendicular to the propagation direction, which is a locus of points traced out by the electric field vector of the radiation as it propagates. If the relative phase of the two components of the Jones vector is zero, the Jones vector represents linearly polarized radiation. If the Jones vector has two components of equal magnitude and a relative phase difference of $\pm\pi/2$, the Jones vector represents circularly polarized radiation. Jones vectors "live" in a vector space spanned by the polarization states of polarized radiation. Therefore, ignoring depolarization effects, the polarization state of an electromagnetic wave exiting an optical system may be expressed as a product of a Jones matrix for that optical system with the Jones vector for the polarization state of the electromagnetic wave entering the optical system. The Jones matrix is a 2×2 complex matrix and therefore contains 8 scalar parameters. In general, the Jones matrix will vary across the pupil plane of the optical system. A Jones pupil may be defined as a set of Jones matrices for different parts of the pupil and field planes.

Various different parameterizations of the 8 scalar components of a Jones matrix have been proposed. One such parameterization uses the singular value decomposition to express the Jones matrix for an optical system as a product of terms in terms corresponding to the following five well defined optical elements: (a) partial polarizers, (b) rotators, (c) retarders, (d) a scalar phase (phase plate) and (e) a scalar transmission (gray filter). The scalar phase and scalar transmission have been described above in relation to unpolarized radiation whereas the first three optical elements produce additional polarization dependent effects. A partial polarizer results in diattenuation, wherein the transmission of the optical element is dependent upon the orientation of the polarization state of radiation entering the element. A rotator is an optical element that rotates a given polarization state. A retarder results in birefringence, wherein, in general, the relative phases of different components of the polarization state will change.

In particular, an arbitrary Jones matrix may be decomposed as the product of a scalar transmission, a scalar phase, a Jones matrix for a general partial polarizer and a Jones matrix for a general retarder. The Jones matrices for a retarder and a partial polarizer each have two mutually perpendicular eigenvectors. In general, these eigenvectors will be Jones vectors corresponding to elliptically polarized radiation. Assuming that the ellipticities of the eigenstates of the partial polarizer and the retarder in this decomposition are negligible (which may be so to a good approximation for a lithographic projection system), a general Jones matrix J may be written as:

$$J = t e^{i\Phi} J_{pol}(d,\theta) \cdot J_{ret}(\phi,\beta), \qquad (1)$$

where t is a scalar transmission, $\Phi$ is a scalar phase, $J_{pol}(d,\theta)$ is the Jones matrix for a partial polarizer and $J_{ret}(\phi,\beta)$ is the Jones matrix for a retarder. Therefore, the Jones matrix factorizes as a product of polarization dependent ($J_{pol}$ and $J_{ret}$) and polarization independent (t and $\Phi$) parts. In this approximation, the Jones matrix can be well described using 6 scalar parameters. Note that even if the assumption that the two ellipticity parameters are small did not hold, their effects can be separated and treated separately from the above parameters.

The Jones matrix $J_{ret}(\phi,\beta)$ for a retarder whose eigenstates have zero ellipticity (i.e. eigenstates corresponding to linearly polarized radiation) is given by:

$$J_{ret}(\phi,\beta) = \begin{pmatrix} \cos\beta & -\sin\beta \\ \sin\beta & \cos\beta \end{pmatrix} \begin{pmatrix} e^{-i\phi} & 0 \\ 0 & e^{i\phi} \end{pmatrix} \begin{pmatrix} \cos\beta & \sin\beta \\ -\sin\beta & \cos\beta \end{pmatrix}, \qquad (2)$$

where a relative phase difference of $2\phi$ is introduced between the two orthogonal eigenstates and $\beta$ is the angle that the two eigenstate directions make with the axes of the coordinate system.

The Jones matrix $J_{pol}(d,\theta)$ for a partial polarizer whose eigenstates have zero ellipticity (i.e. eigenstates corresponding to linearly polarized radiation) is given by:

$$J_{pol}(d,\theta) = \begin{pmatrix} \cos\theta & -\sin\theta \\ \sin\theta & \cos\theta \end{pmatrix} \begin{pmatrix} 1+d & 0 \\ 0 & 1-d \end{pmatrix} \begin{pmatrix} \cos\theta & \sin\theta \\ -\sin\theta & \cos\theta \end{pmatrix}, \qquad (3)$$

where d is a parameter describing the transmission difference for the two eigenstates states and $\theta$ is the angle that the two eigenstate directions make with the axes of the coordinate system.

Retardation or partial polarization may be represented by a Jones matrix, as described above. Retardation alters the relative phase of two separate components of the Jones vector whereas partial polarization alters the relative magnitudes of the two separate components. The above mentioned Jones matrices for a retarder $J_{ret}(\phi,\beta)$ and a partial polarizer $J_{pol}(\theta,e)$ each have two mutually perpendicular eigenvectors that represent orthogonal linearly polarized radiation states. In the case of a retarder, these represent fast and slow axes whereas in the case of a partial polarizer, they represent bright and dark axes. In each case, the effect of the Jones matrix on the polarization state of electromagnetic radiation is described by: a parameter ($\phi$ or d) which describes how the two eigenstates of the Jones matrix are affected; and a parameter ($\beta$ or $\theta$) which describes the angle in real space between the two eigenstates and the axes of the coordinate system onto which the electromagnetic radiation state has been projected. Therefore, both retardation and partial polarization can be represented by a magnitude and an angle and can therefore formally be represented by a two dimensional vector. However, some care is required when defining such vectors.

The Jones matrices for a retarder $J_{ret}(\phi,\beta)$ and a partial polarizer $J_{pol}(d,\theta)$ are both invariant under a rotation by $\pi$ (i.e. $\beta \rightarrow \beta+\pi$ or $\theta \rightarrow \theta+\pi$), as can be seen by expanding out equations (2) and (3) respectively. Furthermore, a rotation by $\pi/2$ has the effect of swapping the effects on the two orthogonal polarization components of the Jones vector. However, the effects on each of the two polarization components are inverse to each other and therefore a rotation by $\pi/2$ is equivalent to the transformation $\phi \rightarrow -\phi$ or $d \rightarrow -d$, respectively. That is, a rotation by $\pi/2$ changes the sign of the effect. This leads to the definition of an orientator $O(A,\psi)$, which has a magnitude A and a direction $\psi$ in real space and which can be represented by a two dimensional vector in real space with a directional angle of $2\psi$:

$$O(A, \psi) = A \begin{pmatrix} \cos 2\psi \\ \sin 2\psi \end{pmatrix}. \qquad (4)$$

An orientator defined in this way has the following properties that makes it suitable for expressing retardance and/or partial polarization: (i) two orientators enclosing an angle of $\pi$ are equivalent; (ii) two orientators enclosing an angle of $\pi/2$ are inverse (i.e. one is the negative of the other); and (iii) two orientators enclosing an angle of $\pi/4$ are orthogonal (i.e. their inner product vanishes).

A Jones pupil may be described (assuming that the ellipticities are negligible) by: a scalar transmission map; a scalar relative phase (wavefront) map; an orientator retardation map; and an orientator diattenuation map. The two scalar maps may be expressed as a linear combination of Zernike polynomials. The two orientator maps may be expressed as a linear combination of a complete set of basis orientator functions. A particularly convenient set is the orientator Zernike polynomials (OZPs), which form a set of orthogonal orientator functions defined on a unit circle. A determination of each map may involve determining the coefficients in such an expansion of either Zernike polynomials or OZPs. Note that, since the OZPs are orthogonal on the unit circle, the orientator Zernike coefficients may be determined by calculating the inner product of a measured scalar map with each OZP in turn and dividing this by the square of the norm of that OZP.

Referring again to FIG. 2, the stage 12 involves the determination of a scalar relative phase (aberration) map 12a and an orientator retardation map 12b, whereas the stage 14 involves the determination of a scalar transmission (apodization) map 14a and an orientator diattenuation map 14b. Therefore, each stage 12, 14 involves the determination of a map of a polarization dependent property of the projection system PL, which is either a retardation map or a diattenuation map.

In order to determine the map of the polarization dependent property of the projection system PL in the pupil plane, three or more calibration radiation beams with different polarization modes are directed through the projection system PL. This may be achieved, for example, using the adjuster AM of the illuminator IL. During the stage 12, for each calibration radiation beam (and thus for each polarization mode), a wavefront that exits the projection system PL is determined. This is achieved using a shearing interferometer comprising a diffraction grating, which is a two dimensional grid in an image plane of the projection system PL (i.e. the substrate table WT), and an array of CCDs arranged to detect an interference pattern by measuring an intensity map. The wavefront is determined from the measured interference pattern, as described above. During the stage 14, for each calibration radiation beam (and polarization mode), an intensity map of the radiation exiting the projection system PL is determined. This may be achieved using the same array of CCDs used to detect the interference pattern during the stage 12.

In each stage 12, 14 the maps for the three or more calibration radiation beams are then combined to determine a map of the magnitude and/or direction of a polarization dependent property of the optical system across a pupil plane thereof. As explained above, retardation and diattenuation can each be described using two parameters (for example, either the two parameters in each of equations (2) and (3) or the magnitude and angular direction of an orientator). Therefore, if it was possible to determine the two components of the Jones vector for radiation leaving the projection system PL, two calibration radiation beams with different polarization modes would be sufficient to determine the two parameters that describe the retardation or diattenuation. However, in both stages, the CCD array measures an intensity distribution, which is related to the square of the polarization vector. Therefore, in order to reconstruct a retardation or diattenuation map at least three calibration radiation beams with different polarization modes should be used, and desirably more.

Taking the determination of retardation in stage 12 as an example, the general procedure is as follows. The relative phase as determined, for example, by a shearing interferometer is given by:

$$\Phi_{speudo}(r,\upsilon) = \Phi_x(r,\theta) \cdot \cos(2\phi) + \Phi_y(r,\theta) \cdot \sin(2\phi), \qquad (5)$$

where $\Phi_{speudo}(r,\theta)$ is the relative phase, which is a function of the co-ordinates of the pupil plane, r and $\theta$; $\phi$ is the angle that the polarization of the radiation makes with the x axis of the pupil plane and $\Phi_{x,y}(r,\theta)$ are the two components of an orientator representing retardation. A set of coefficients for an expansion of $\Phi_{speudo}(r,\theta)$ in terms of Zernike polynomials may be determined (by calculating the inner product of a measured scalar map with each Zernike polynomial in turn and dividing this by the square of the norm of that Zernike polynomial). The orientator representing retardation can be expanded as a sum of OZPs:

$$\begin{pmatrix} \Phi_x(r,\vartheta) \\ \Phi_y(r,\vartheta) \end{pmatrix} = \sum_n R_n(r) \begin{pmatrix} \cos(m\theta) & \cos(m\theta) & \sin(m\theta) & \sin(m\theta) \\ \sin(m\theta) & -\sin(m\theta) & -\cos(m\theta) & \cos(m\theta) \end{pmatrix} \begin{pmatrix} OZ_n \\ OZ_{-n} \\ OZ_{n+1} \\ OZ_{-(n+1)} \end{pmatrix}, \qquad (6)$$

where $R_n(r)$ are radial polynomials, m is the degree of the azimuthal dependence and $OZ_i$ is the ith OZP coefficient. The measured Zernike coefficients, $Z_i$, are related to the OZP coefficients by:

$$\begin{pmatrix} Z_n \\ Z_{n+1} \end{pmatrix} = \frac{1}{2}\begin{pmatrix} \cos(2\varphi) & \cos(2\varphi) & -\sin(2\varphi) & \sin(2\varphi) \\ \sin(2\varphi) & -\sin(2\varphi) & \cos(2\varphi) & \cos(2\varphi) \end{pmatrix}\begin{pmatrix} OZ_n \\ OZ_{-n} \\ OZ_{n+1} \\ OZ_{-(n+1)} \end{pmatrix}. \quad (7)$$

By measuring the relative phase $\Phi_{speudo}(r,\theta)$ for a range of polarization angles $\phi$, equations (5) to (7) can be used to construct a matrix that relates the measured Zernike coefficients to the OZP coefficients. By using at least three polarization directions, one can solve this design matrix using, for example, a least squares method such as a LSQ procedure.

Figure 4:
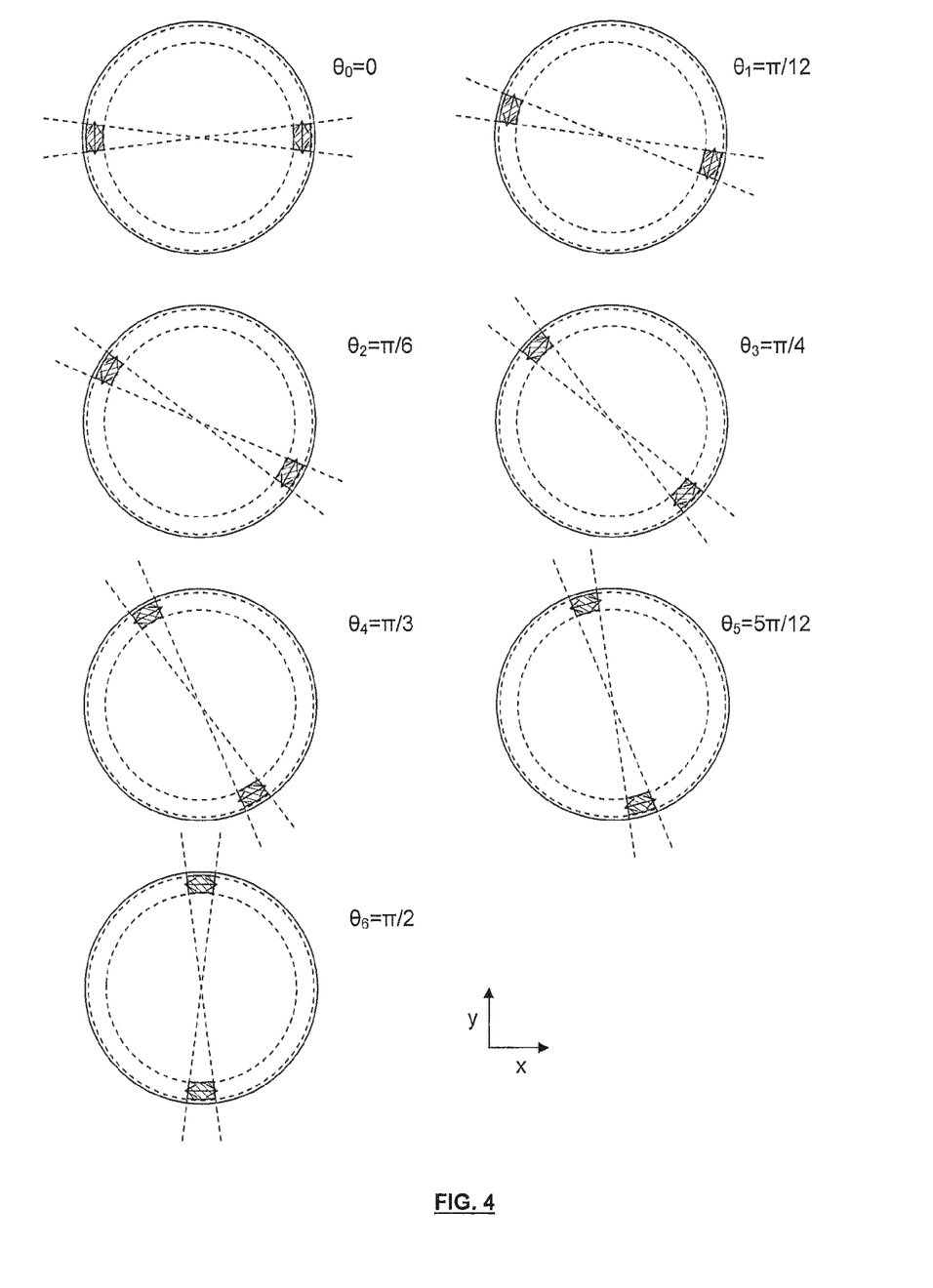
FIG. 4 illustrates the intensity and polarization distributions for a plurality of calibration radiation beams used in the methods illustrated in FIGS. 2 and 3.

The illuminator IL may be configured to sequentially produce calibration radiation beams with a range of different polarization modes. Because retardation and diattenuation change sign under rotation through a real angle of $\pi/2$ radians, it is sufficient to generate polarization states within an angular range of $\pi/2$ radians. In one embodiment, the illuminator IL is configured to sequentially produce calibration radiation beams in a dipole illumination mode. The calibration radiation beams are linearly polarized in a direction that is substantially perpendicular to a line that bisects the two opposing sectors of the dipole. The orientation of the dipoles for different calibration radiation beams is different. The orientation direction may vary through a range of $\pi/2$ radians. The illumination and polarization modes for the calibration radiation beams of such an embodiment are shown in FIG. 4. In this embodiment, seven different polarization states are used, the angle between the polarization direction and the y axis being given by $\theta_n=n\pi/12$, where n=0, 1, 2, 3, 4, 5 or 6. In an embodiment, the illuminator IL may be configured to sequentially produce calibration radiation beams with different polarization modes but with the same illumination mode (i.e. for such embodiments the polarization mode is altered independently of the illumination mode).

The retardation and diattenuation maps of the projection system PL contain the information to determine how the polarization of an input radiation beam will be altered by the projection system PL. The retardation and diattenuation maps of the projection system may be stored in a memory. The memory may for example form part of, or be associated with, the lithographic apparatus which contains the projection system PL. The retardation and diattenuation maps of the projection system may subsequently be retrieved from the memory.

Figure 5A:
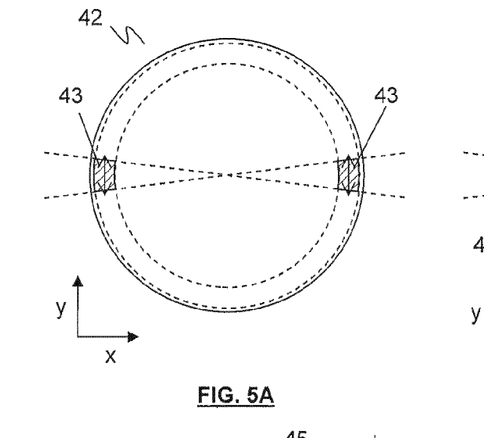
FIG. 5A shows the intensity and polarization distribution for a dipole illumination mode.
Figure 5B:
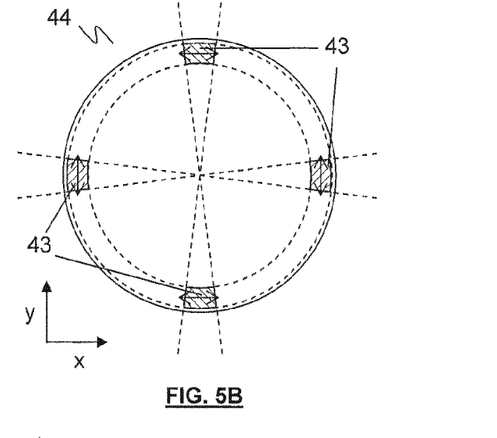
FIG. 5B shows the intensity and polarization distribution for a quadrupole illumination mode.
Figure 5C:
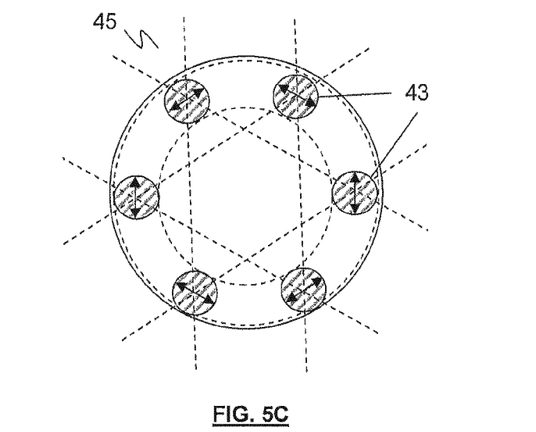
FIG. 5C shows an intensity and polarization distribution for a hexapole illumination mode.

During subsequent operation of the lithographic apparatus LA, the radiation source SO produces a beam of radiation, which is conditioned by the illuminator IL to produce a radiation beam PB with a desired illumination and polarization mode. That is, the radiation beam PB will have a particular intensity and polarization distribution in a pupil plane of the illuminator IL. For example, the illumination mode may be a dipole distribution 42 as shown in FIG. 5A, a quadrupole distribution 44 as shown in FIG. 5B, or a hexapole distribution 45 as shown in FIG. 5C. The dipole distribution 42 comprises two diametrically opposed pole regions 43 where the intensity is non-zero, defined by the intersection of an annulus and two diametrically opposed sectors of a circle. A line that bisects the two opposing sectors is generally in the x direction and the radiation is linearly polarized in the y direction. The quadrupole distribution 44 comprises a first dipole distribution similar to that shown in FIG. 5A and a second dipole distribution rotated relative to the first by $\pi/2$ radians but otherwise identical to it. Therefore the quadrupole distribution 44 comprises four pole regions 43 where the intensity is non-zero. Radiation in each pole region is linearly polarized in a direction generally perpendicular to a line that bisects it. This polarization mode may be referred to as XY polarization and can achieve good results in contrast in the image formed on the substrate W. The hexapole distribution 45 comprises six pole regions 43 distributed around a circle. Radiation in each pole region is linearly polarized in a direction generally perpendicular to a line that bisects it. This polarization mode may be referred to as TE polarization. Hexapole illumination with TE polarization may be used, for example, when forming an image of an array of holes or an array of blocks.

Referring again to FIG. 2, a radiation map 22 of the radiation beam PB in a pupil plane of the projection system PL, which comprises an intensity component 22a and a polarization component 22b, is determined at step 20. In the embodiment illustrated in FIG. 2, no pattern is applied to the beam (e.g., no patterning device is present in the lithographic apparatus). Thus, the intensity 22a and polarization 22b of the radiation beam PB is determined solely by the illuminator IL. The illuminator IL may be configured to produce radiation with fixed intensity and polarization modes in a predictable and reproducible way. For such embodiments, the intensity 22a and polarization 22b of the radiation beam PB may therefore be known. Alternatively, the intensity 22a and polarization 22b of the radiation beam PB may be measured. The intensity 22a of the radiation beam PB may be determined in a similar way to the determination of the apodization of the projection system PL. Radiation may be projected through an aperture in an object plane of the projection system PL (i.e. the plane of the patterning device MA), and through the projection system PL, and the intensity of radiation in a plane that is conjugate to a pupil plane of the projection system PL may be measured using a detector. For determining the intensity 22a, rather than a point source in the object plane, a larger aperture is used. Once again, the same detector as is used to measure the wavefront to determine aberrations may be used. The polarization 22b of the radiation beam PB may be determined in a similar way if the aperture in the object plane comprises a polarization selection device such as an analyzer which only transmits radiation with a given polarization direction. By, for example, rotating the analyzer to a plurality of different directions and measuring the intensity of radiation using the detector, the polarization 22b state of the radiation beam PB may be determined.

Figure 3:
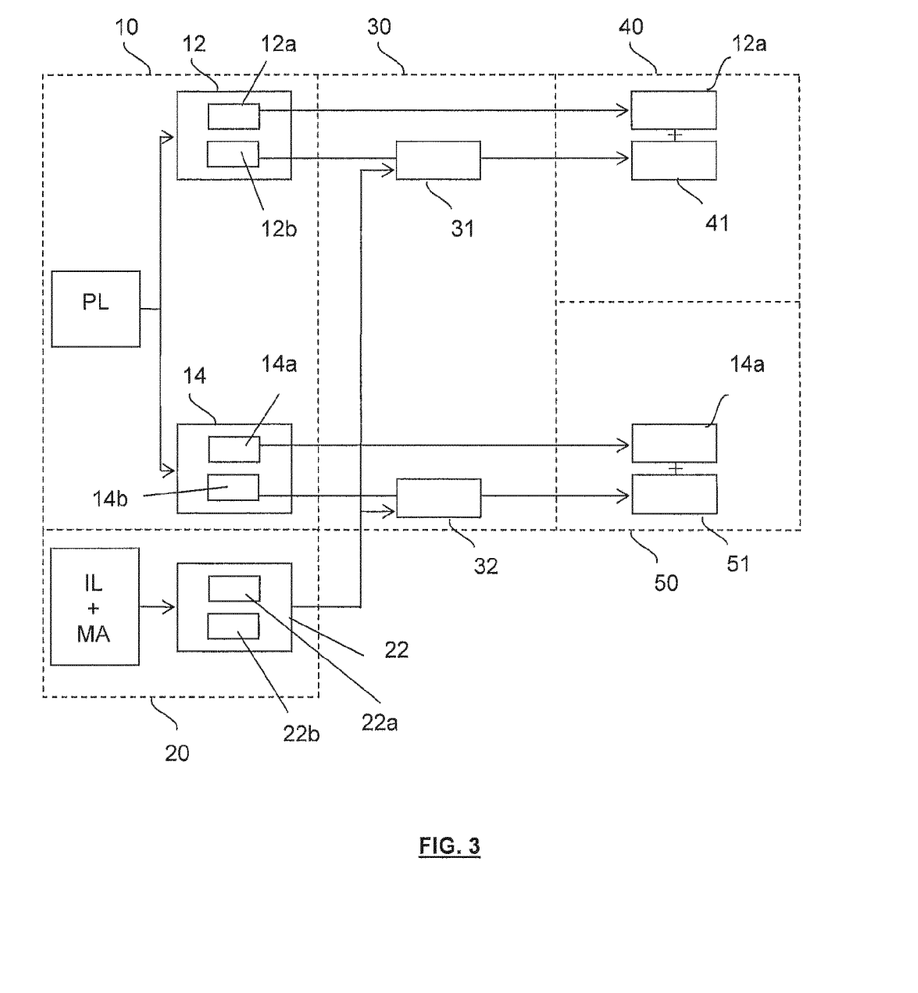
FIG. 3 is a schematic illustration of a method of correcting an image according to a further embodiment of the present invention.

Referring to FIG. 3, in an embodiment, a patterning device MA is present in the lithographic apparatus LA and applies a pattern to the radiation beam. Thus, the radiation map of the intensity 22a and polarization 22b of the radiation beam PB in a pupil plane of the projection system PL, determined at step 20, depends upon the illuminator mode and on the pattern of the patterning device MA. The intensity 22a and polarization 22b of the radiation beam PB may be measured as described above in relation to the embodiment illustrated in FIG. 2.

Referring to both FIG. 2 and FIG. 3, at step 30, the retardation map 12b and/or the diattenuation map 14b of the projection system PL is combined with the radiation map 22 of the radiation beam PB to form an image map 31, 32 in the pupil plane of the projection system PL. That is to say, the intensity and polarization of the radiation beam PB is combined with the retardation and/or diattenuation maps to form an image map 31, 32 that describes how the relative phase and/or amplitude of the two components of the polarization state of the radiation will be affected by the projection system PL. The image maps 31, 32 therefore contain information regarding the polarization state of radiation that is to be projected by the projection system PL onto a substrate W on the substrate table WT.

Each image map 31, 32 is then used to determine a correction map 41, 51 which describes the difference between that image map 31, 32 and the radiation map 22. For an ideal projection system whose Jones matrix is the identity matrix across the entire pupil plane, one would expect the image map to be identical to the radiation map, i.e. for the correction map to be zero. However, for a real projection system PL, at least one of the correction maps 41, 51 will be non-zero and will represent a deviation from an ideal projection system.

The correction maps 41, 51 can then be used to correct an optical image that is formed at the substrate table WT (e.g. on a substrate W), when the radiation beam PB is directed through the projection system PL. In general, the projection system PL is such that the phase dependent factors (aberration and retardation) can be adjusted but transmission dependent factors (apodization and diattenuation) cannot. Therefore, the mechanism by which the image formed on the substrate W is corrected may be different in the two cases, as will now be described. In an embodiment, phase dependent factors (aberration and retardation) may be corrected without correcting for transmission dependent factors (apodization and diattenuation). In an embodiment, transmission dependent factors (apodization and diattenuation) may be corrected without correcting for phase dependent factors (aberration and retardation). In an embodiment, transmission dependent factors (apodization and diattenuation) and phase dependent factors (aberration and retardation) may both be corrected together.

Step 10 may be considered to characterize the field points for a given projection system PL, and step 20 may be considered to describe aspects of a lithographic process (which has no field or projection system dependence). Step 30 combines these components to form a projection system, field and lithographic process dependent correction map (41, 51), which may be applied.

For phase dependent corrections, at step 40, the scalar relative phase (aberration) map 12a and the retardation correction map 41 are combined and the adjustment mechanism PA of the projection system PL is used to correct a projected optical image using this combination. A dynamic optical element (lens) model may be used to calculate how the projection system PL should be adjusted to implement the correction. A processor may be used to calculate how the projection system PL should be adjusted to implement the correction.

The correction may be determined via different routes. In a first route the retardation is translated into aberration. Since the retardation is field dependent, this results in field dependent aberration targets (i.e. targets which depend upon the illumination mode). A patterning device MA may be present in the lithographic apparatus and apply a pattern. If this is the case then the retardation will depend upon the illumination mode and the pattern of the patterning device MA. In more detail, one or more (projection system, field and lithographic process dependent) target retardation maps are assembled. These are transformed into aberration target maps (using equations (5) to (7)). That is, orientation Zernikes are transformed into Zernikes. The retardation is field dependent (i.e. depends upon the illumination mode and the patterning device MA (if present)). Thus, based upon the lithographic process conditions (step 20) it is determined how each target aberration map is influenced by each Zernike coefficient. The dynamic optical element model relates the change of each Zernike coefficient to a change of optical element configuration. It calculates how the optical elements should be manipulated so that the aberration target maps are realized.

In a second route the retardation and aberration are converted into one or more lithographic parameters such as displacement and defocus. That is, the impact of retardation and aberration on one or more lithographic parameters is determined. This results in one or more linear dependencies: the relation between the one or more lithographic parameters and aberration (expressed as Zernike coefficients), and the relation between one or more lithographic parameters and retardation (expressed as orientation Zernike coefficients). Again, the retardation map is combined with these dependencies to create lithographic target maps. Within the dynamic optical element model the aberration is optimized to match the target maps.

Amplitude dependent corrections may be applied in addition to (or instead of) phase dependent corrections. For amplitude dependent corrections, at step 50, the scalar transmission (apodization) map 14a and the diattenuation correction map 51 are combined and this combination is used to at least partially correct the image by altering the input radiation beam that enters the projection system PL. This may be achieved by a suitable design of the pattern of the patterning device MA using one or more computational lithographic techniques such as, for example, optical proximity simulation. That is, the diattenuation (measured at step 14b without the pattern present) is directly taken into account when calculating the transfer of a pattern from patterning device MA to substrate image through the projection system PL. This calculation is performed within a lithographic simulator (which may be in the form of software running on a computer). The fact that diattenuation is dependent on the projection system PL and field points complicate such calculations. Therefore, in some embodiments, the calculations may only take into account a portion of the diattenuation that is substantially independent of the projection system PL and field.

Figure 6:
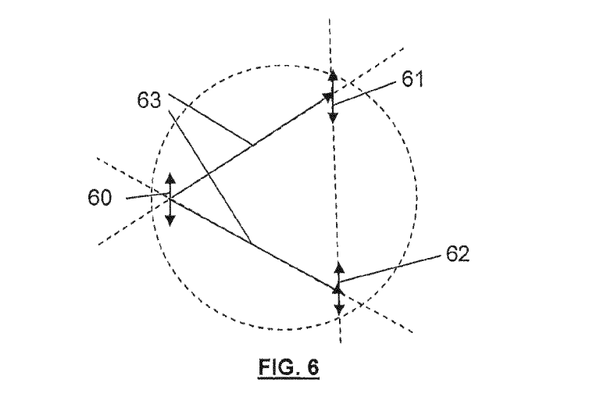
FIG. 6 shows the effect of diffraction by a patterning device pattern on a pole of the hexapole illumination mode.

During exposure of a substrate W using the lithographic apparatus LA the patterning device MA will impart a pattern to the radiation beam before it propagates through the projection system PL. A typical pattern may comprise a series of lines and/or two dimensional features. The pattern of the patterning device MA may cause diffraction of the radiation beam. In the embodiment shown in FIG. 3, the patterning device MA that is used to pattern the input radiation beam used to form the image on the substrate W is used in step 20. In particular, the patterning device information is combined with information from the illuminator IL to form a combined radiation map 22. The combined radiation map 22 comprises an intensity component 22a and a polarization component 22b of the radiation beam PB in a pupil plane of the projection system PL (including information from the pattern of the patterning device MA). This is particularly advantageous for embodiments wherein the pattern of the patterning device MA comprises two dimensional features and the polarization mode comprises different polarizations (e.g. TE polarization, as shown in FIG. 5C). This is because with such embodiments diffraction due to the patterning device MA can cause mixing of radiation from the different poles, which may have different polarizations. This is illustrated schematically in FIG. 6, which shows how diffraction of a single pole region 60 of a hexapole mode by a patterning device pattern can cause mixing of radiation from that pole into other poles. The patterning device pattern may for example be an array of blocks which causes diffraction in the directions indicated by the arrows 63. Thus, radiation in the pole region 60 on the left hand side of FIG. 6 is diffracted into the pole regions 61, 62 at the top right and bottom right of FIG. 6. By combining the patterning device MA pattern information with intensity and polarization information from the illuminator IL, the retardation and diattenuation maps will take into account such diffraction effects caused by the patterning device MA.

A pattern of a patterning device is not applied in the embodiment shown in FIG. 2. Thus, the diffraction effect of a patterning device upon the polarization of radiation entering the projection system PL is not taken into account in the retardation and diattenuation maps. However, the maps indicate retardation and diattenuation that occurs for different illumination modes, and thus may provide useful retardation and diattenuation corrections. Although the correction provided may not be as accurate as a correction which takes into account the patterning device MA information, it may provide a significant improvement compared with the situation if no correction for retardation and diattenuation were to be applied.

Although in the embodiment described above aberration and retardation are corrected by adjusting the projection system PL, alternatively or additionally, these effects may corrected for, at least partially in patterning device design using computational lithography.

In the above described method, the steps may be performed once. Alternatively, step 10 and/or step 20 may be performed periodically. If performed periodically, steps 10 and 20 may be performed at different rates. Each time step 10 and/or step 20 is performed step 30 and step 40 and/or step 50 may be performed.

Although in the above embodiment, the method corrects for both polarization dependent and polarization independent properties of the projection system PL, an embodiment may only correct for polarization dependent effects.

Although in the above embodiment, the method corrects for both effects that can be corrected by adjusting the projection system PL and effects that can be corrected by suitable patterning device design, alternative embodiments may only correct for one or the other. For example, the method may only correct for retardation effects by adjusting the projection system PL.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media;

optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention.

The invention claimed is:

1. A method of correcting an optical image formed by an optical system, the method comprising:
    obtaining a map indicative of a polarization dependent property of the optical system across a pupil plane of the optical system for spatial positions in an image plane of the optical system;
    forming an image map indicative of a polarization property of an output radiation beam of the optical system, wherein the forming comprises combining the map indicative of the polarization dependent property of the optical system with a radiation map indicative of an intensity and a polarization property of an input radiation beam of the optical system; and
    correcting, based on the image map, the optical image formed by directing the input radiation beam through the optical system.

2. The method of claim 1, further comprising imparting a pattern to the input radiation beam by a patterning device before the input radiation beam enters the optical system,
    wherein the radiation map has information relating to the pattern.

3. The method of claim 2, wherein the correcting of the optical image comprises modifying a pattern of the patterning device.

4. The method of claim 1, wherein the correcting of the optical image comprises determining a correction map based on a difference between the image map and the radiation map.

5. The method of claim 1, wherein the correcting of the optical image comprises using the image map to determine an effect of the polarization dependent property on the optical image formed by directing the input radiation beam through the optical system.

6. The method of claim 1, wherein the correcting of the optical image comprises manipulating an optical element of the optical system.

7. The method of claim 1, wherein the obtaining of the map indicative of the polarization dependent property comprises measuring the map indicative of the polarization dependent property.

8. The method of claim 7, wherein the measuring of the map indicative of the polarization dependent property comprises:
    sequentially directing three or more calibration radiation beams with different polarization states through the optical system;
    determining an output map of a property of the radiation exiting the optical system for each calibration radiation beam; and
    combining the output maps to determine a map indicative of a magnitude and a direction of the polarization dependent property of the optical system across the pupil plane.

9. The method of claim 8, wherein the polarization dependent property of the optical system comprises retardation and the output map of the property of the radiation exiting the optical system comprises a wavefront.

10. The method of claim 9, wherein wavefronts that exit the optical system are measured using a shearing interferometer.

11. The method of claim 8, wherein the polarization dependent property of the optical system comprises diattenuation and the output map of the property of the radiation exiting the optical system comprises an intensity map.

12. The method of claim 8, wherein the one or more of the calibration radiation beams have a dipole intensity distribution and are linearly polarized in a direction that is substantially perpendicular to a line that bisects two opposing sectors of the dipole.

13. The method of claim 1, wherein the obtaining of the map indicative of the polarization dependent property comprises modeling an effect of the optical system on the input radiation beam using a modeling software.

14. The method of claim 1, wherein the obtaining of the map indicative of the polarization dependent property comprises determining coefficients in a linear expansion of orientation Zernike polynomials (OZPs).

15. The method of claim 1, wherein the obtaining of the map indicative of the polarization dependent property comprises retrieving the map from a memory.

16. The method of claim 1, wherein the correcting comprises correcting optical aberrations due to an effect of a polarization independent property of the projection system.

17. The method of claim 1, wherein the optical system is a projection system of a lithographic apparatus.

18. A lithographic apparatus comprising:
a substrate table configured to hold a substrate;
a projection system configured to project a radiation beam having a pattern onto a target portion of the substrate to form an image thereon; and
a processor configured to:
obtain a map indicative of a polarization dependent property of the projection system across a pupil plane thereof for spatial positions in an image plane of the projection system;
form an image map indicative of a polarization property of an output radiation beam of the projection system;
combine the map indicative of the polarization dependent property with a radiation map indicative of an intensity and a polarization property of an input radiation beam of the projection system in the pupil plane; and
correct an image, based on the image map, formed by the projection system.

19. The lithographic apparatus of claim 18, wherein the processor is further configured to determine a correction map based on a difference between the image map and the radiation map.

20. The lithographic apparatus of claim 18, wherein the polarization dependent property of the projection system comprises retardation or diattenuation.

* * * * *